United States Patent
Kulkarni et al.

(10) Patent No.: US 8,467,263 B2
(45) Date of Patent: Jun. 18, 2013

(54) MEMORY WRITE OPERATION METHODS AND CIRCUITS

(75) Inventors: Jaydeep P. Kulkarni, Hillsboro, OR (US); Muhammad M. Khellah, Tigard, OR (US); Bibiche M. Geuskens, Beaverton, OR (US); Arijit Raychowdhury, Hillsboro, OR (US); Tanay Karnik, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 285 days.

(21) Appl. No.: 12/823,642

(22) Filed: Jun. 25, 2010

(65) Prior Publication Data
US 2011/0317508 A1    Dec. 29, 2011

(51) Int. Cl.
*G11C 8/00*    (2006.01)

(52) U.S. Cl.
USPC ............ 365/230.06; 365/189.09; 365/189.11; 365/154; 365/185.26; 365/185.23

(58) Field of Classification Search
USPC .............. 365/154, 185.18, 185.23, 185.26, 365/156, 181, 189.16, 189.09, 189.11, 230.06
See application file for complete search history.

(56) References Cited

U.S. PATENT DOCUMENTS

| | | | | |
|---|---|---|---|---|
| 5,295,106 A * | 3/1994 | Jinbo | | 365/218 |
| 5,689,473 A * | 11/1997 | Toda | | 365/233.1 |
| 5,990,514 A * | 11/1999 | Choi et al. | | 257/315 |
| 6,044,017 A * | 3/2000 | Lee et al. | | 365/185.18 |
| 6,097,651 A * | 8/2000 | Chan et al. | | 365/203 |
| 6,426,914 B1 * | 7/2002 | Dennard et al. | | 365/230.06 |
| 8,045,394 B2 * | 10/2011 | Do | | 365/185.23 |
| 2004/0042254 A1 | 3/2004 | Noro | | |
| 2005/0281071 A1 | 12/2005 | Jeon | | |
| 2008/0304344 A1 * | 12/2008 | Do | | 365/201 |
| 2009/0175067 A1 | 7/2009 | Houston | | |
| 2009/0175210 A1 | 7/2009 | Vijayan et al. | | |
| 2009/0273014 A1 * | 11/2009 | Arigane et al. | | 257/315 |

OTHER PUBLICATIONS

Notice of Allowance mailed Jan. 18, 2012 for Chinese Patent Application No. 201120217291.1.
Int'l Search Report and Written Opinion mailed Jan. 9, 2012 for Int'l Patent Application No. PCT/US2011/040458.

* cited by examiner

*Primary Examiner* — Kretelia Graham
(74) *Attorney, Agent, or Firm* — Blakely, Sokoloff, Taylor & Zafman LLP

(57) ABSTRACT

In some embodiments, write wordline boost may be obtained from wordline driver boost and/or from bit line access transistor boost.

11 Claims, 7 Drawing Sheets

MEMORY WRITE OPERATION METHODS AND CIRCUITS

BACKGROUND

The minimum operational supply voltage (Vccmin) is an important parameter of today's processors. Reducing Vccmin is an effective way to reduce the power consumption of a processor. Memory cells such as those in register files (e.g., inside a processor core) are typically the limiting blocks in reducing Vccmin. With memory cells, Vccmin may the maximum of three components: write Vccmin, read Vccmin, and retention Vccmin.

FIG. 1 shows a conventional 8T register file cell. With such a cell, write Vccmin may be the worst of the three, i.e., require the highest level. The 8T (M1 to M8) cell of FIG. 1 has a memory cell formed from transistors M1-M4, write access transistors M5-M6, and read access transistors M7-M8. There is a write wordline (WWL) for turning on the write access transistors M5-M6 when data is to be written into the cell (from write bit lines WRBL, WRBL#) and a read wordline (RDWL) to turn on access transistor M8 to read the data in the cell based on whether it turns on or off access transistor M7. Also included is a word line driver 102 (formed from inverter P1/N1) to drive the write word line High or Low based on the value of its input (WLIN).

For a write operation, the write bit-lines (WRBL and WRBL#) are complementarily driven according to the data to be written into the cell. The write word-line (WWL) is then driven high so that data are written into the complementary nodes D# and D of the cell via the write pass gate transistors M5 and M6, respectively. Unfortunately, a contention issue between the pass gate transistor (M5 or M6) that is to write a '0' into the cell and its associated pull-up transistor (M1 or M3, respectively) can occur, especially as the Vccmin level supplying the cell (M1, M3) goes down.

There have been several different approaches for redressing write contention issues. Dynamic VCC collapse is a write assist technique that can give write Vccmin improvement. However, at lower supply voltage levels, the magnitude and duration of the VCC collapse must generally be limited due to the retention of the unselected cells on the same column. Further, VCC-collapse techniques primarily help the write contention but may adversely affect the write completion process.

Wordline boosting is another write-assist technique that can help contention as well as the write completion process. Integrated charge pump and level shifter circuits are used to provide wordline boosting, thereby allowing for write Vccmin to be lowered. Unfortunately, charge pump and level shifting based boosting require careful design and power management in order to attain net power savings. Accordingly, new approaches may be desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In accordance with some embodiments, methods and circuits for implementing word line boosting are disclosed. Word line boosting may be used as an effective write-assist technique, especially with ever lowering supply voltages, as it may be employed without significantly (if at all) adversely affecting the retention of unselected cells on the same column.

In some embodiments, the write wordline (WWL) may be boosted using capacitive coupling onto the write wordline. in this way, WWL boosting may be achieved without the need for power hungry charge pumps or complex level shifters (although in some inventive embodiments, they may be included along with capacitive boost capabilities, as taught herein, depending on particular design concerns). The overlap capacitance that is already present in most cases, e.g., part of the gate overlap capacitance on driver and access FETs, may be used to create capacitively boosted voltage on the WWL.

Figure 2:
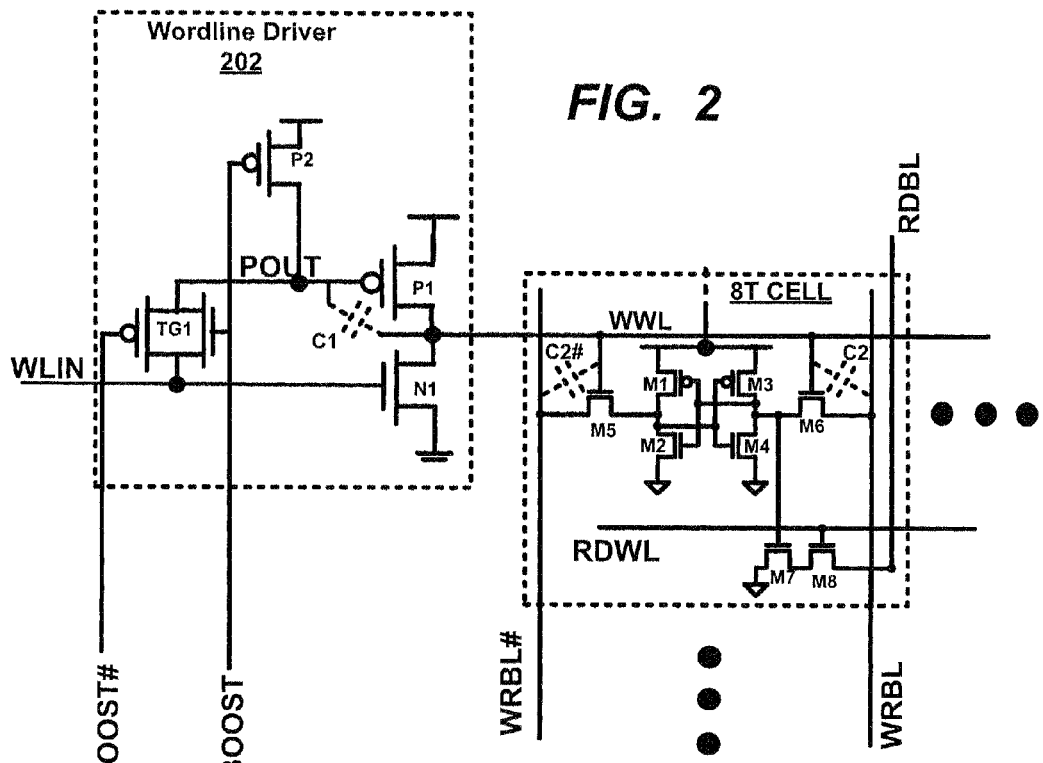
FIG. 2 shows a memory cell with a write wordline boost driver in accordance with some embodiments.
Figure 3:
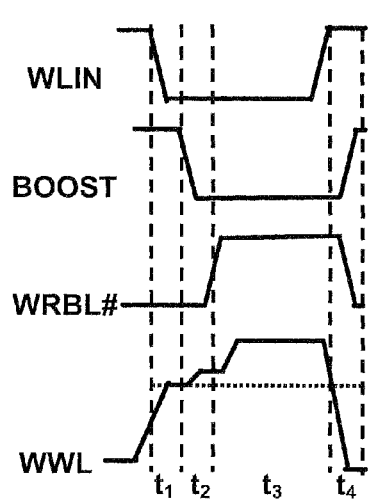
FIG. 3 is a timing diagram, in accordance with some embodiments, showing some of the signals indicated in FIG. 2.

FIG. 2 shows a memory cell with a write wordline boost driver 202 for implementing capacitively coupled wordline boosting. The boost driver comprises transistors N1, P1, and P2, along with transmission-gate TG1, coupled together as shown. FIG. 3 is a timing diagram showing signal timing relationships for effectuating a write operation with wordline boost. Over-lap capacitances (C1, C2), an inherent parasitic part of MOS transistors, are shown for driver transistor P1 and access transistors M5, M6 since they are used to generate the WWL voltage boosts with this embodiment. (Note that if write bit line boost is implemented, as described below, either M5 or M6 will contribute a charge boost, depending on which of the two complementary bit lines writes the '1'.) So, in the depicted embodiment, the depicted capacitors are not separate capacitive components, but rather, in this embodiment, represent capacitive elements that are normally a part of a P or N type MOSFET. Thus, while inventive embodiments do not preclude the use of added capacitances or transistors with enhanced capacitances, such additional capacitance may (and likely will) not be required in many designs.

(Note that the term P-type transistor refers herein to a P-type metal oxide semiconductor field effect transistor, "MOSFET". Likewise, N-type transistor refers to an N-type metal oxide semiconductor field effect transistor. It should be appreciated that whenever the terms: "MOS transistor", "NMOS transistor", "N-type transistor", "P-type transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.)

With additional reference to FIG. 3, for a write operation, the input (WL IN) of the WWL driver is asserted (High-to-Low here) to create a Low to High transition on the WWL node. At this time, the transmission gate TG1 is on, so P1/N1 effectively acts as an inverter driver, outputting a High onto the WWL node. After a short delay (indicated by $t_1$ in FIG. 3), the Boost signal is asserted (Low, and Boost# is asserted (High) to turn off the transmission gate and to turn on P2, which turns off P1 relatively hard. With the transmission gate turned off, N1 also remains off, thereby causing the WWL node to float. With P2 turning on and bringing POUT up to a High level (approaching VCC) relatively quickly, much of the charge across the overlap capacitance C1 from P1 is thus projected (or coupled) onto the floating WWL node and added to the High charge that is already present on it. This rise due to the capacitive boost is shown with the WWL signal within the $t_2$ interval indicated in FIG. 3.

A second capacitance (e.g., C2# or C2 from access transistors M5 and M6) may be used to further boost the voltage on the WWL node. To enable use of this second capacitance, both the WRBL and WRBL# (also referenced as WBL and WBL#) are made low prior to a write operation and then one of them (depending on the value to be written into the cell) is brought up to a High just slightly after the WWL has been floated from the first step ($t_1$), i.e., after the Boost signal is asserted, with this embodiment. The achieved boost from the active C2 capacitor (C2# or C2 depending on which one goes High) is shown within the $t_3$ interval of FIG. 3. The use of this type of boost from bit line access transistors may be scalable to a large number of cells per bit line as all cells on the same write-wordline are written simultaneously.

Figure 4:
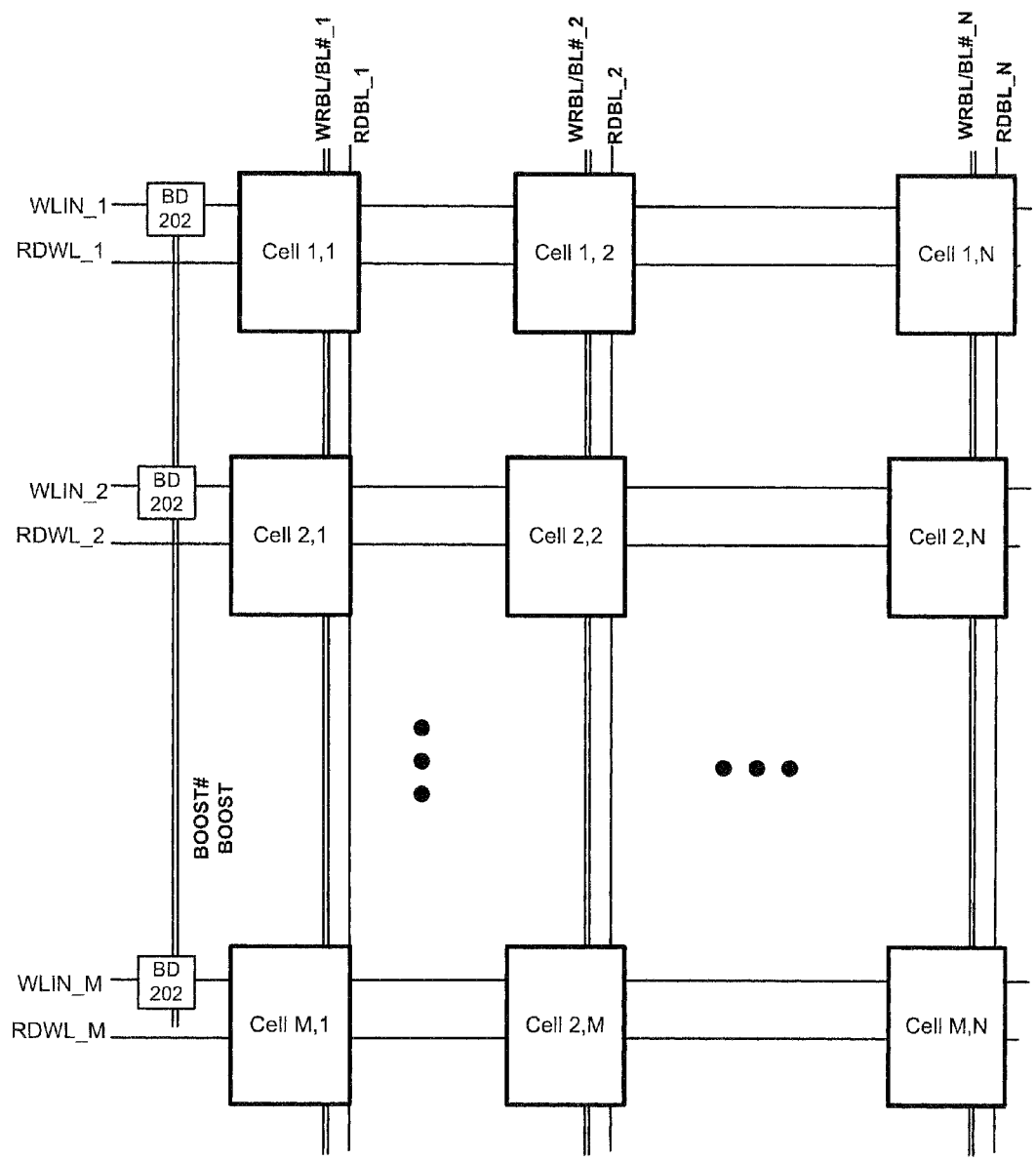
FIG. 4 shows register file array including cells such as those shown in FIG. 2 in accordance with some embodiments.
Figures 5, 6:
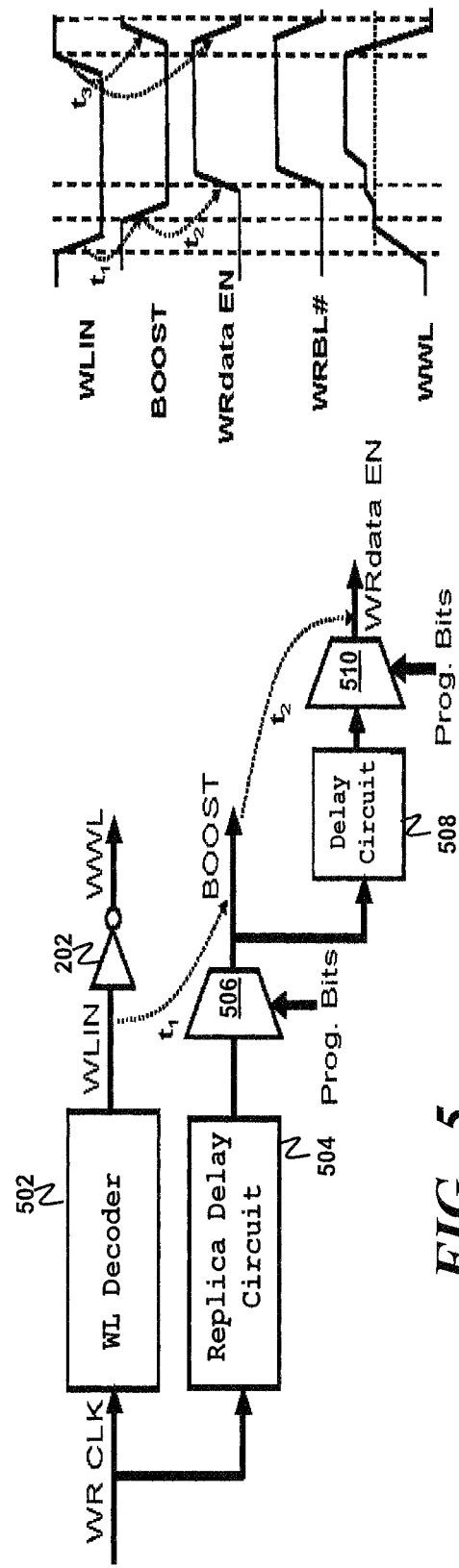
FIG. 5 shows a circuit for generating boost and word line write enable signals in accordance with some embodiments.
FIG. 6 is a timing diagram showing some of the signals for the circuit of FIG. 5 in accordance with some embodiments.
Figure 9:
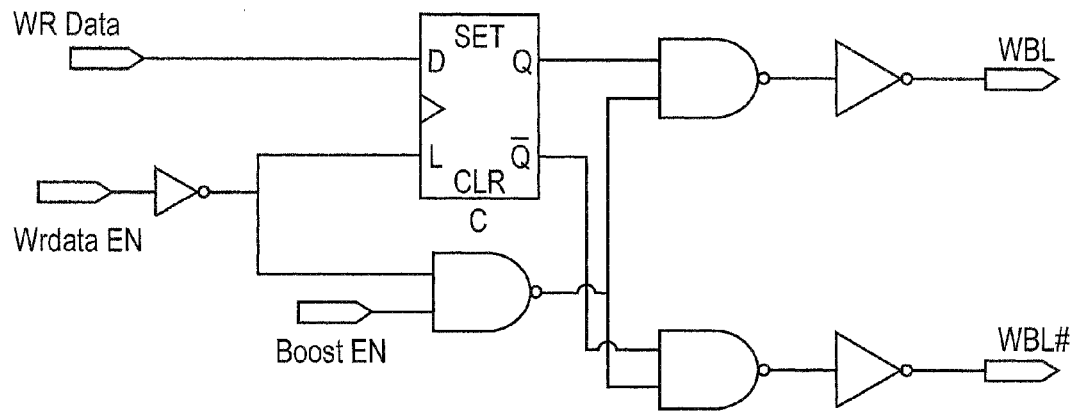
FIG. 9 shows a write data driver circuit in accordance with some embodiments.
Figure 10:
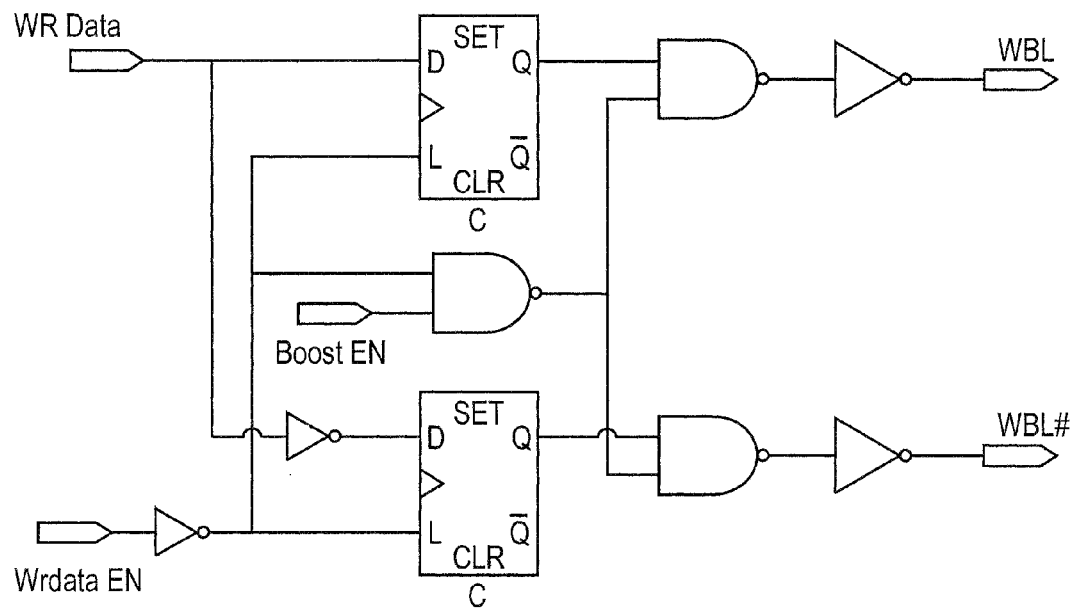
FIG. 10 shows a write data driver circuit in accordance with some additional embodiments

FIG. 5 shows a circuit that may be used to generate signals for implementing a boostable write operation through a wordline such as through the WWLs of FIGS. 2 and 4. In the depicted embodiment, the signal generation circuit generates Boost and Write-data-enable (WR data EN) signals for performing write operations. (Note that a Boost# signal can be generated off of a Boost signal using an inverter, and while not shown in the circuit diagrams of FIGS. 2 and 4, a WRdata EN signal is a signal used to enable the complementary data on the WR bit lines to be written into a cell. FIGS. 9 and 10 show two different circuits for implementing '0' to data/data# transitions on the write bit lines.) The depicted signal generation circuit comprises a replica delay circuit 504 (to replicate delay through relevant WWL decoder logic 502), programmable delay circuits 506, 510, and fixed delay circuit 508, coupled as shown to Write operation decoder circuitry 502 and WL driver 202. The replica delay circuitry 504 suitably models (or replicates) the delay through relevant write operation decoder gates, between a write clock (WR CLK) signal and the WLIN signal from FIG. 2. The programmable delay circuit 506 provides additional delay (taking into account the delay of WWL driver 202) for the WWL to reach a sufficiently High level (e.g., approaching VCC) before asserting the Boost signal and thereby floating the WWL node. So, programmable delay 506 may be used to control the delay corresponding to t1 in FIGS. 3 and 6. Delay circuit 508 and programmable delay circuit 510 are used to control when complementary write data ("1-'0 or '0-'1) is applied to (or driven onto) the complementary bit lines (WRBL, WRBL#) relative to assertion of the Boost signal. So, delay elements 508 and 510 may be used to control delay $t_2$ in FIGS. 3 and 6. Any suitable circuitry, such as the circuits of FIGS. 9 and 10, may be used to control both bit lines (WBL and WBL#) to be Low prior to the writing of the complementary data.

This approach may be considered to be an open loop approach in that it uses a replica delay circuit 504 to "replicate" the delay from the WRITE CLK to the WL IN signal, as opposed to directly tracking off of either or both the WL IN or WWL signals. It is useful in that it tracks WL decoder delay across different PVT (process, voltage, temperature) conditions, deviations, etc. In some embodiments, after manufacturing testing, the values for the programmable delays 506, 510 may be identified and/or set to attain suitable results. In other embodiments, control circuitry may be used to "tweak" the values in order to achieve desired operation. Along these lines, closed loop approaches could also be employed. Regardless of how accomplished, ideally, the WWL node should reach (or at least suitably approach) its full High level before it is floated.

Figure 7:
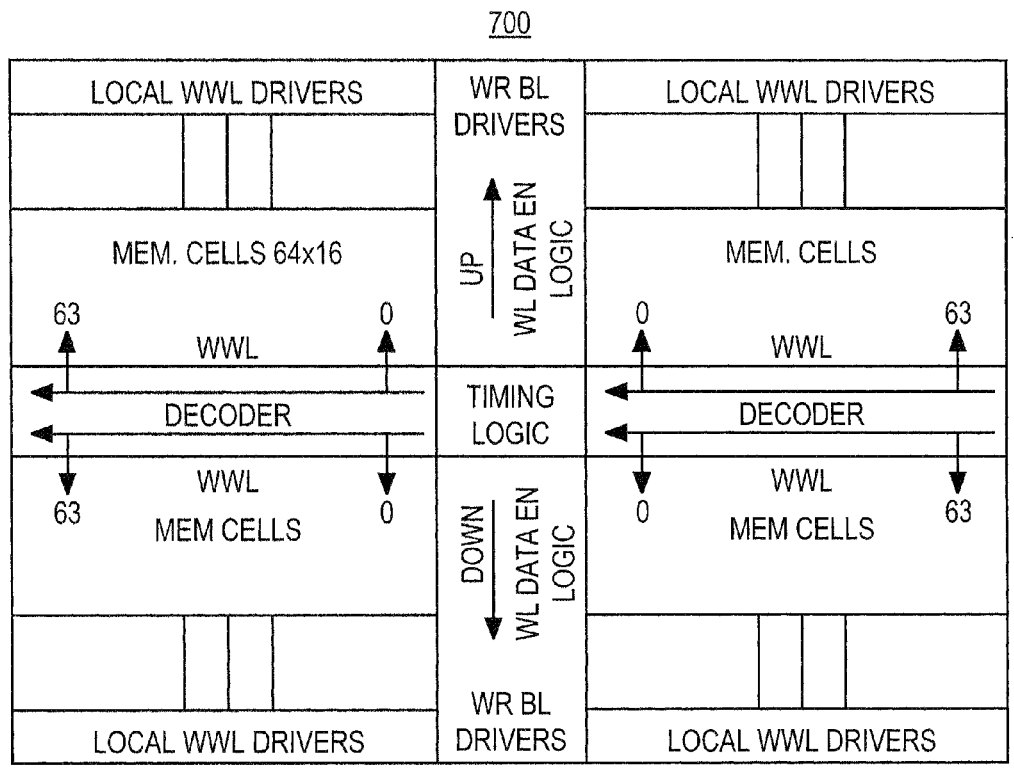
FIG. 7 shows a sub-array floor-plan with boost and write data enable routing in accordance with some embodiments.
Figure 8:
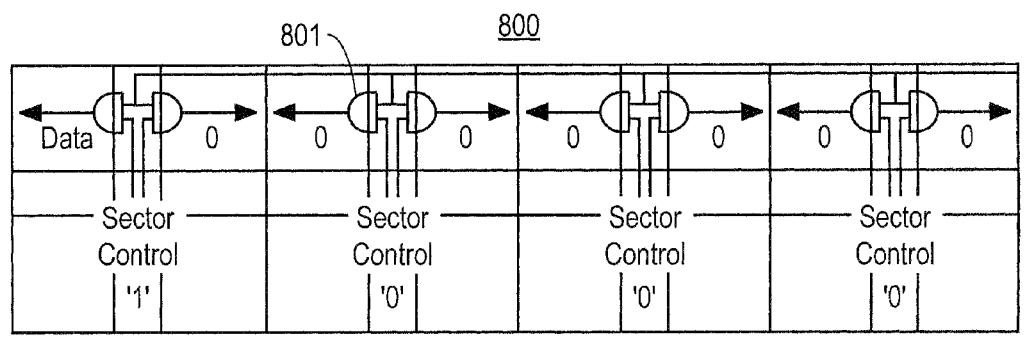
FIG. 8 shows circuitry for implementing sub-array parking in accordance with some embodiments.

FIG. 4 shows an array of M×N cells having boostable wordline drivers (BD) 202 for driving their WWLs. This array may comprise any number of cells in any desired configuration and this array may be organized into separate sub-arrays, which may be separately de-activated (parked) and enabled. For example, FIG. 7 shows a possible sub-array layout "floor plan" including WWL drivers and Write Enable routing, and FIG. 8 shows an approach for "parking" certain sub-array sectors. When a particular sub-array/sector is not selected and when not otherwise in use, the respective write bit lines may be parked to '0' (Low) states. This saves dynamic power due to write bit line switching in unselected sub-arrays. Also, such BL parking at Low states impedes gate leakage in the access transistors between the WWLs and bit lines that would otherwise have a "1" (High level) compared to parking to '1' state.

In the preceding description, numerous specific details have been set forth. However, it is understood that embodiments of the invention may be practiced without these specific details. For example, while an 8T memory cell is shown and described, any memory cell structure using a wordline, especially a separate wordline for writing data into it, may take advantage of the boost techniques discussed herein. So, so-called 4T and 6T cells, to mention just a few, may also be used with the boost techniques. Similarly, different embodiments may incorporate some or all of the inventive features described herein. For example, boost may be obtained from a boostable driver, from access transistor boost, or from both a boostable driver and access transistor boost.

In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

Figure 1:
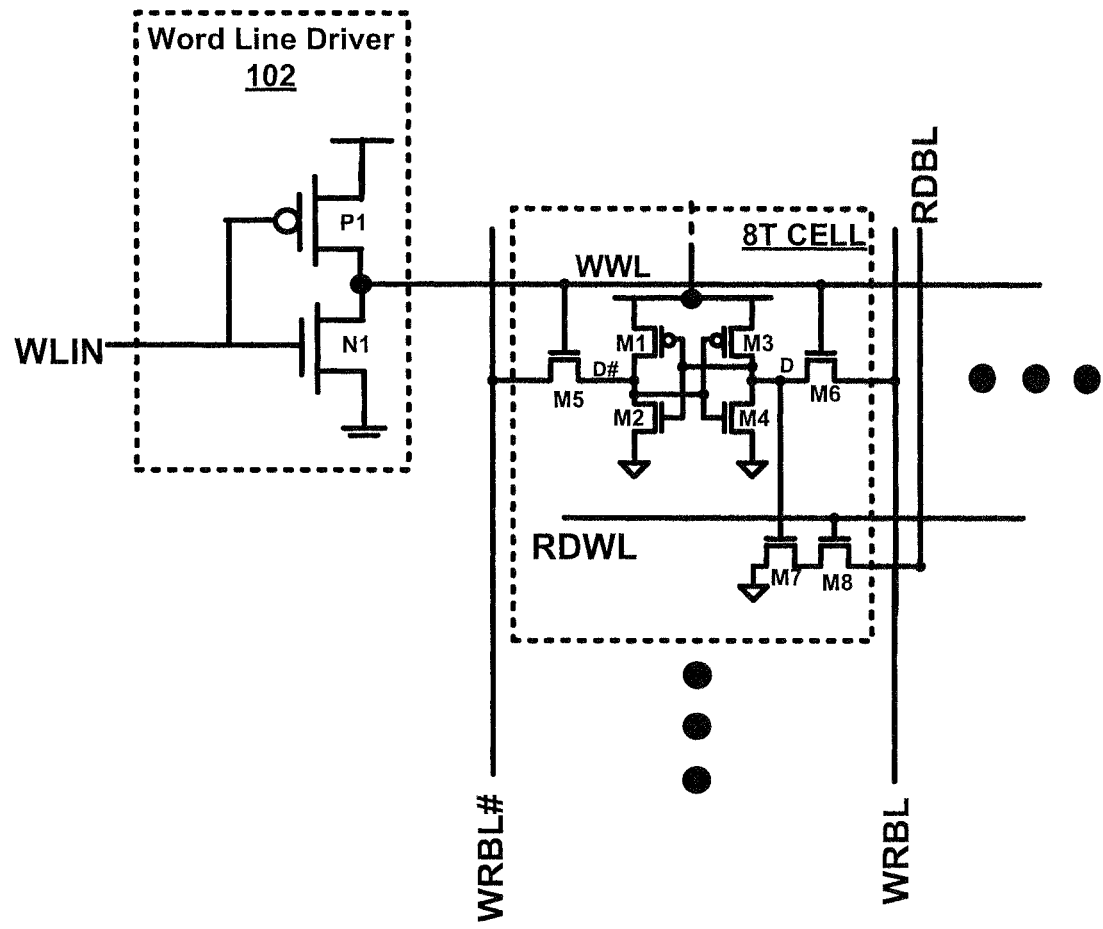
FIG. 1 shows a conventional memory cell with write wordline driver.

Referring to FIG. 1 and FIG. 2, the term RDBL refers to "read bit line." The signal RDBL is coupled to transistor M8 of the memory cell. Referring to FIG. 4, the term "WLIN_1" refers to wordline input to the BD 202 for driving write word line to the cells in the first row. The term "WLIN_M" refers to word line input to the BD 202 for driving write wordline to the cells in the row M. Likewise, the term "WLIN_2" refers to word line input to the BD 202 for driving write wordline to the cells in the second row. The term "RDWL_1" refers to read wordline which is a signal provided to the cells in the first row. The term "RDWL_M" refers to read wordline which is a signal provided to the cells in the row M. The term "RDWL_2" refers to read wordline which is a signal provided to the cells in the second row. The term "Cell M,N" refers to memory cell in the array of memory cells at row M and column N. Referring to FIG. 5, the term "Prog. Bits" refers to input signals to programmable delay circuits 506 and 510. Referring to FIG. 10, the term "Boost EN" refers to Boost enable signal to enable the Boost feature discussed herein.

Referring to FIG. 7, an embodiment 700 is shown having a sub-array floor-plan with BOOST and WRdata EN routings. For the sake of brevity, all terms previously discussed with reference to FIGS. 1-6 are not re-iterated here. As shown in the floor-plan 700, LOCAL WWL DRIVERS are positioned on the periphery while the WR BL DRIVERS are positioned substantially in the center of the floor plan, wherein each sub-array of memory cells (MEM. CELLs 64×16) are coupled to their respective LOCAL WWL DRIVERS and WR BL DRIVERS. In this floor-plan each sub-array of MEM. CELLS receives 64 bits of WWL DECODER signals (i.e., bits 0 to 63). In the floor-pan the TIMING LOGIC is positioned in the center of the floor-plan 700. The arrows indicating "UP" and "DOWN" indicate the WL DATA EN LOGIC for the MEM. CELLS above and below the DECODER. Referring to FIG. 8, an embodiment 800 is shown for impending sub-array parking. When a particular sub-array/sector is not selected and when not otherwise in use, the respective write bit lines may be parked to '0' (Low) states, which is indicated by the output of the logic gate 801. This saves dynamic power due to write bit line switching in unselected sub-arrays. Also, such BL parking at Low states impedes gate leakage in the access transistors between the WWLs and bit lines that would otherwise have a "1" (High level) compared to parking to '1' state.

Figure 11:
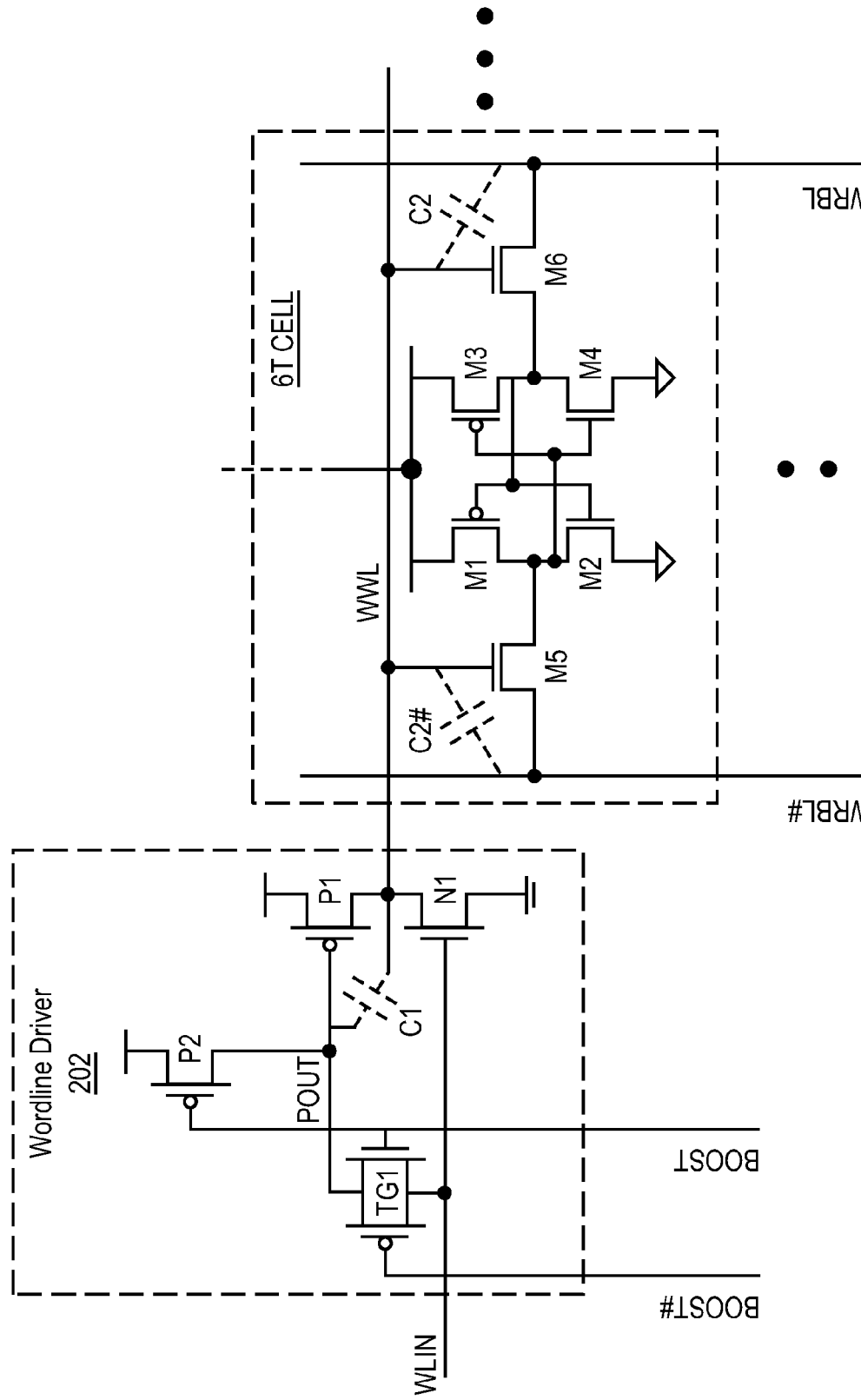
FIG. 11 shows a 6T memory cell with a write wordline boost diver, in accordance with some embodiments.

FIG. 11 shows a 6T memory cell with a write wordline boost diver, in accordance with some embodiments. FIG. 11 is similar to FIG. 2. So as not to obscure the embodiments of the disclosure, only the differences between FIG. 2 and FIG. 11 are discussed. In FIG. 11, transistors M7 and M8 are removed from the memory cell making the memory cell a 6T memory cell i.e., a memory cell with six transistors M1, M2, M3, M4, M5, and M6.

What is claimed is:

1. An apparatus comprising:
   memory cells on a wordline; and
   a driver circuit coupled to the wordline to couple the wordline to a ground reference for a de-asserted state and to initially couple the wordline to a supply reference and then to float the wordline to capacitively boost the wordline for a write operation,
   wherein the driver circuit comprises a P-type and an N-type transistor coupled to the wordline,
   wherein the P-type transistor is operable to couple the wordline to the supply reference during another state,
   wherein the N-type transistor is operable to couple the wordline to the ground reference during the de-asserted state,
   wherein the P-type and N-type transistors are operable to float the wordline, wherein the P-type and N-type transistors have inputs controllably coupled to one another through a switch to cause the wordline to be in a floating state, and wherein the switch is a transfer gate formed from N-type and P-type transistors.

2. The apparatus of claim 1, wherein the memory cells comprise register file cells with separate bit lines and wordlines for writing and reading data.

3. The apparatus of claim 1, wherein the memory cells are 8T cells.

4. The apparatus of claim 1, wherein the memory cells comprise 6T static random access memory cells.

5. The apparatus of claim 1 further comprises complementary write bit line pairs that are coupled to the memory cells through access transistors, wherein low values are applied to each bit line in a complementary write bit line pair, of the complementary write bit line pairs, before data is written into a memory cell from among the memory cells.

6. The apparatus of claim 1 further comprises a signal generator circuit comprising programmable delay.

7. A chip comprising:

a wordline coupled to a plurality of cells through access transistors; and a wordline driver circuit coupled to the wordline to apply:

a first state to turn off the access transistors, a second state to turn on the access transistors, and a third state to further turn on the access transistors, said second and third states to be entered for writing data into the plurality of cells, wherein the wordline driver circuit comprises a P-type and an N-type transistor coupled to the wordline, wherein the P-type transistor is operable to couple the wordline to the High reference during the second state, wherein the N-type transistor is operable to couple the wordline to the Low reference during the first state, wherein the P-type and N-type transistors are operable to float the wordline, wherein the P-type and N-type transistors have inputs controllably coupled to one another through a switch to cause the wordline to be in a floating state, and wherein the switch is a transfer gate formed from N-type and P-type transistors.

8. The chip of claim 7, wherein the plurality of cells include a memory cell which is an 8T cell.

9. The chip of claim 7, wherein the wordline is a write wordline for activating the access transistors to write data into a cell from the plurality of cells.

10. The chip of claim 7 further comprises a programmable delay circuit coupled to the first and second transistors to cause the first and second transistors to decouple during the third state.

11. The chip of claim 7, wherein the plurality of cells is coupled together to implement a register file.

* * * * *